(12) United States Patent
Tanaka et al.

(10) Patent No.: US 8,276,265 B2
(45) Date of Patent: Oct. 2, 2012

(54) ELECTRONIC COMPONENT MOUNTING MACHINE AND ELECTRONIC COMPONENT LOADING HEAD

(75) Inventors: Yuji Tanaka, Yamanashi (JP); Tomohiro Kimura, Yamanashi (JP)

(73) Assignee: Panasonic Corporation, Osaka (JP)

( * ) Notice: Subject to any disclaimer, the term of this patent is extended or adjusted under 35 U.S.C. 154(b) by 52 days.

(21) Appl. No.: 13/123,078

(22) PCT Filed: Oct. 8, 2009

(86) PCT No.: PCT/JP2009/005256
§ 371 (c)(1),
(2), (4) Date: Apr. 7, 2011

(87) PCT Pub. No.: WO2010/041458
PCT Pub. Date: Apr. 15, 2010

(65) Prior Publication Data
US 2011/0192021 A1 Aug. 11, 2011

(30) Foreign Application Priority Data
Oct. 10, 2008 (JP) .............................. P2008-263774

(51) Int. Cl.
*H05K 3/30* (2006.01)
*B23P 19/00* (2006.01)
(52) U.S. Cl. ............... 29/743; 29/833; 29/739; 29/740; 29/741; 29/832
(58) Field of Classification Search ............. 29/739, 29/740, 741, 743, 832, 833
See application file for complete search history.

(56) References Cited

U.S. PATENT DOCUMENTS 5,010,474 A * 4/1991 Tsuruta et al. .................. 700/57
6,148,511 A * 11/2000 Taguchi ........................ 29/834
(Continued)

FOREIGN PATENT DOCUMENTS
JP 06-237097 A 8/1994
(Continued)

OTHER PUBLICATIONS
International Search Report for PCT/JP2009/005256 dated Nov. 2, 2009.

*Primary Examiner* — Derris Banks
*Assistant Examiner* — Anthony Green
(74) *Attorney, Agent, or Firm* — Pearne & Gordon LLP (57) ABSTRACT

A challenge to be met by the present invention is to provide an electronic component mounting machine and an electronic component loading head in which the loading head has two rows of nozzle shafts and that can promote miniaturization of the machine by minimizing the loading head. In a loading head having two rows of nozzles (L1 and L2) including a plurality of nozzle shafts arranged in rows and at a predetermined nozzle arrangement pitch, a θ rotary drive mechanism that rotates the nozzle shafts around their axes is configured so as to include driven pulleys (28) coupled to the respective nozzle shafts; a plurality of idlers (30) interposed between the two rows of nozzles (L1 and L2); and endless drive belts (29A and 29B) that transmit rotation of the θ-axis motors (27A and 27B) to the driven pulleys (28). Drive surfaces (29a) of the respective driving belts (29A and 29B) are looped around the respective drive pulleys and the respective driven pulleys, and the other sides of the respective drive surfaces (29a) are looped while guided by the idlers (30).

3 Claims, 5 Drawing Sheets

U.S. PATENT DOCUMENTS

| | | |
|---|---|---|
| 6,606,790 B2 * | 8/2003 | Hidese .............................. 29/832 |
| 6,681,468 B1 * | 1/2004 | Uchiyama et al. ......... 29/407.01 |
| 2002/0092157 A1 * | 7/2002 | Yoshida et al. ................. 29/740 |
| 2003/0192178 A1 * | 10/2003 | Hidese .............................. 29/833 |
| 2006/0179645 A1 * | 8/2006 | Chikuma et al. ................ 29/740 |
| 2009/0183361 A1 * | 7/2009 | Takahira et al. ................ 29/739 |

FOREIGN PATENT DOCUMENTS

| | | |
|---|---|---|
| JP | 08-243971 A | 9/1996 |
| JP | 11-186798 A | 7/1999 |
| JP | 11-261296 A | 9/1999 |
| JP | 2002-001684 A | 1/2002 |
| JP | 2002-185197 A | 6/2002 |

* cited by examiner

ELECTRONIC COMPONENT MOUNTING MACHINE AND ELECTRONIC COMPONENT LOADING HEAD

TECHNICAL FIELD

The present invention relates to an electronic component mounting machine for mounting an electronic component on a substrate and an electronic component loading head used in the electronic component mounting machine.

BACKGROUND ART

An electronic component mounting machine that mounts an electronic component on a substrate is equipped with a component feed part where a plurality of part feeders, like tape feeders storing electronic components, are arranged side by side. The electronic component mounting machine iterates component loading operation including picking up an electronic component from one of the part feeders by use of a loading head and transferring and mounting the thus-picked-up electronic component on a substrate. A multiple loading head equipped with a plurality of suction nozzles is generally adopted in order to meet a demand for enhancement of operation efficiency. By virtue of adoption of the multiple loading head, the loading head can handle a plurality of electronic components as objects of mounting during a course of one mounting turn in which the loading head makes a reciprocal movement between the component feeding part and the substrate.

Such a multiple loading head requires a nozzle rotary drive mechanism that rotates a plurality of suction nozzles around respective nozzle shafts (see Patent Document 1). In the example described in connection with the patent document, a plurality of nozzle shafts are arranged in the form of a straight row. A driving belt is looped over driven pulleys coupled to the nozzle shafts, therefore a plurality of nozzle shafts are rotationally driven by a single θ-axis motor.

RELATED ART DOCUMENT

<Patent Document>
Patent Document 1: JP-A-6-237097

DISCLOSURE OF THE INVENTION

<Problem that the Invention is to Solve>

As further enhancement of efficiency of mounting operation is recently demanded, the number of suction nozzle coupled to the multiple loading head tends to increase when compared with the number of suction nozzles coupled to a related art loading head. However, as the number of nozzle shafts built in one loading head increases, greater difficulty is encountered in configuration and layout of the nozzle rotary drive mechanism. Specifically, an increase in the number of nozzle shafts also entails adoption of a configuration in which nozzles are arranged in a plurality of rows to make the layout smaller. However, adopting the drive layout conforming to the related art, including the technique described in connection with Patent Document 1, for a loading head equipped with two rows of nozzles involving an increased number of nozzle shafts leads to an increase in the size of the loading head, which goes contrary to the demand for a smaller electronic component mounting machine and which entails complication of the nozzle rotary drive mechanism.

Accordingly, the present invention aims at providing an electronic component mounting machine that makes it possible to minimize a loading head having two rows of nozzle shafts, to thus promote miniaturization of the machine, as well as providing an electronic component loading head.

<Means for Solving the Problem>

An electronic component mounting machine of the present invention is an electronic component mounting apparatus that picks up an electronic component by suction and by a suction nozzle from a plurality of part feeders placed side by side within a component feed part and that mounts the electronic component on a substrate positioned by a substrate positioning part, the machine comprising: a loading head on which the suction nozzle is provided in numbers and a head movement unit that moves the loading head between the component feed part and the substrate positioning part; and two rows of nozzles that are provided on the loading head and that includes at a predetermined nozzle arrangement pitch a plurality of nozzle shafts which have at their respective lower ends the suction nozzles and which are vertically movable, a nozzle elevation mechanism for individually actuating the nozzle shafts in a vertical direction, and θ rotary drive mechanisms that rotate the plurality of nozzle shafts around their axes, wherein each of the θ axis rotary drive mechanism has a θ-axis motor whose output shaft is coupled to a drive pulley, driven pulleys coupled to the respective nozzle shafts, a plurality of idlers interposed between the two rows of nozzles, and an endless driving belt that transmits rotation of the θ-axis motor to the driven pulleys; and wherein the driving belt is looped in such a way that a drive surface having drive teeth is looped around the drive pulley and the driven pulleys and that the other side of the drive surface is guided by the idlers.

An electronic component loading head of the present invention is an electronic component head for use in an electronic component mounting machine that picks up an electronic component by suction and by suction nozzles from a plurality of part feeders placed side by side within a component feed part and that mounts the electronic component on a substrate positioned by a substrate positioning part, in which the suction nozzle is provided in numbers, the head comprising: and two rows of nozzles that are provided on the loading head and that includes at a predetermined nozzle arrangement pitch a plurality of nozzle shafts which have at their respective lower ends the suction nozzles and which are vertically movable, a nozzle elevation mechanism for individually actuating the nozzle shafts in a vertical direction, and θ rotary drive mechanisms that rotate the plurality of nozzle shafts around their axes, wherein each of the θ axis rotary drive mechanism has a θ-axis motor whose output shaft is coupled to a drive pulley, driven pulleys coupled to the respective nozzle shafts, a plurality of idlers interposed between the two rows of nozzles, and an endless driving belt that transmits rotation of the θ-axis motor to the driven pulleys; and wherein the driving belt is looped in such a way that a drive surface having drive teeth is looped around the drive pulley and the driven pulleys and that the other side of the drive surface is guided by the idlers.

<Advantage of the Invention>

According to the present invention, an electronic component loading head has two rows of nozzle L1 and L2 including a plurality of nozzle shafts arranged at a predetermined nozzle arrangement pitch in rows. In the electronic component loading head, each of θ rotary drive mechanisms is configured so as to include an θ-axis motor whose output shaft is coupled to a corresponding drive pulley, driven pulleys coupled to the respective nozzle shafts, a plurality of idlers interposed between the two rows of nozzle rows, and an endless driving belt that transmits rotation of the θ-axis motor to the driven pulleys. A drive surface of the driving belt is looped over the drive pulley and the driven pulleys, and the other side of the drive surface is looped while guided by the idlers. The loading head having two rows of nozzles is minimized, so that miniaturization of the electronic component mounting machine can be promoted.

BRIEF DESCRIPTION OF THE DRAWINGS

FIGS. 3 (a) and (b) are descriptive views of a structure of a loading head of the electronic component mounting machine of the embodiment of the present invention.

MODES FOR IMPLEMENTING THE INVENTION

Figure 1:
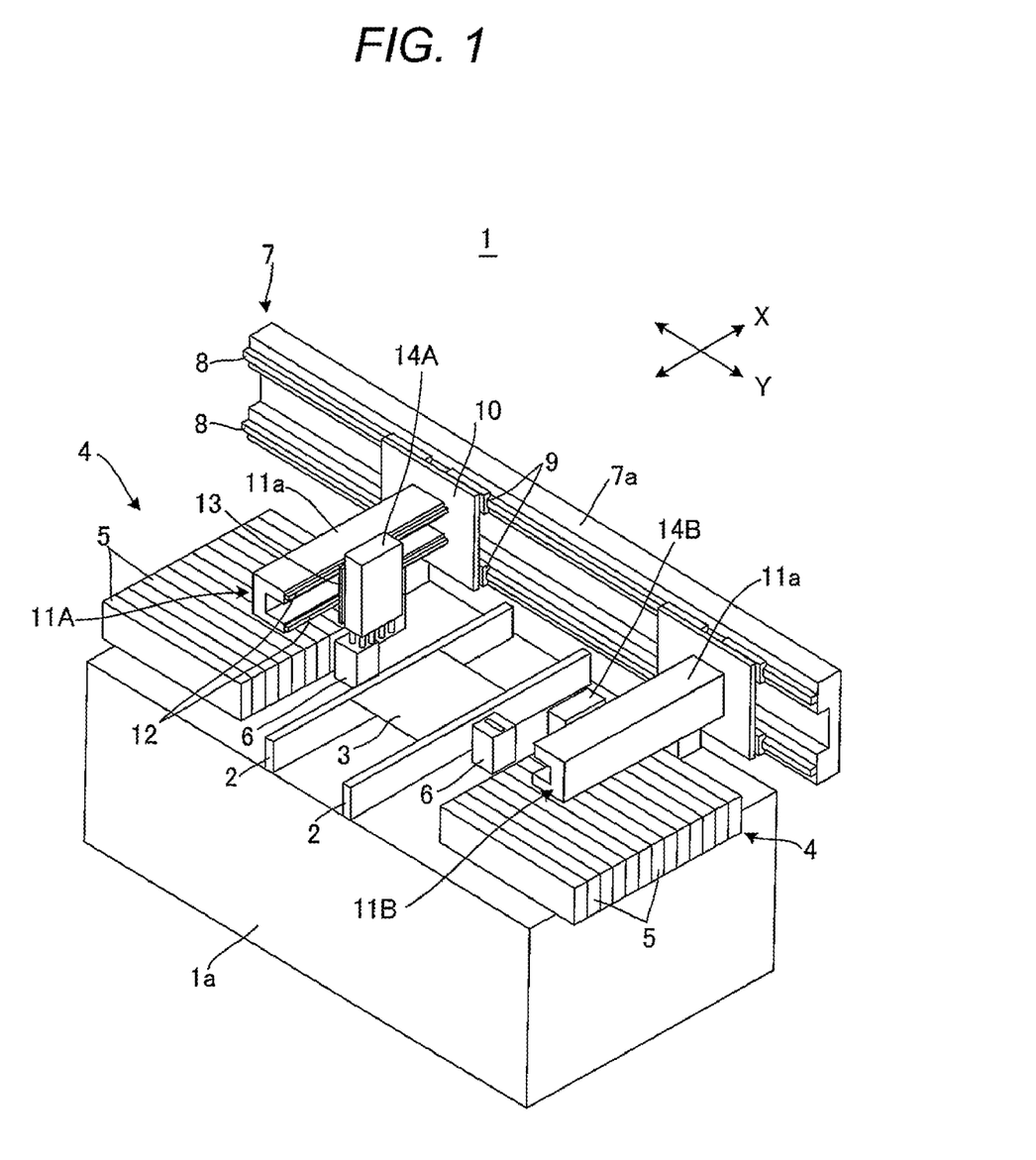
FIG. 1 is an oblique perspective view of an electronic component mounting machine of an embodiment of the present invention.
Figure 2:
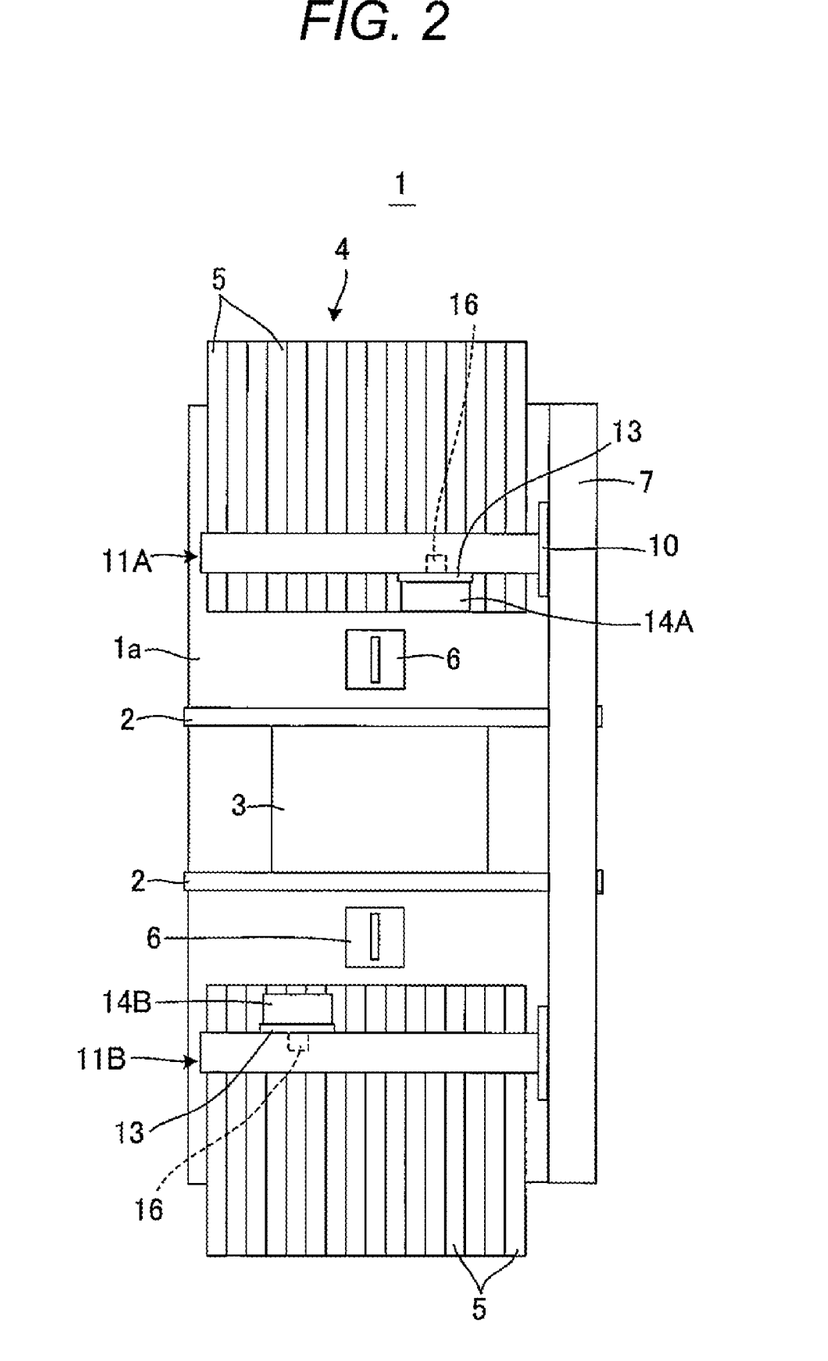
FIG. 2 is a plan view of the electronic component mounting machine of the embodiment of the present invention.
Figure 3:
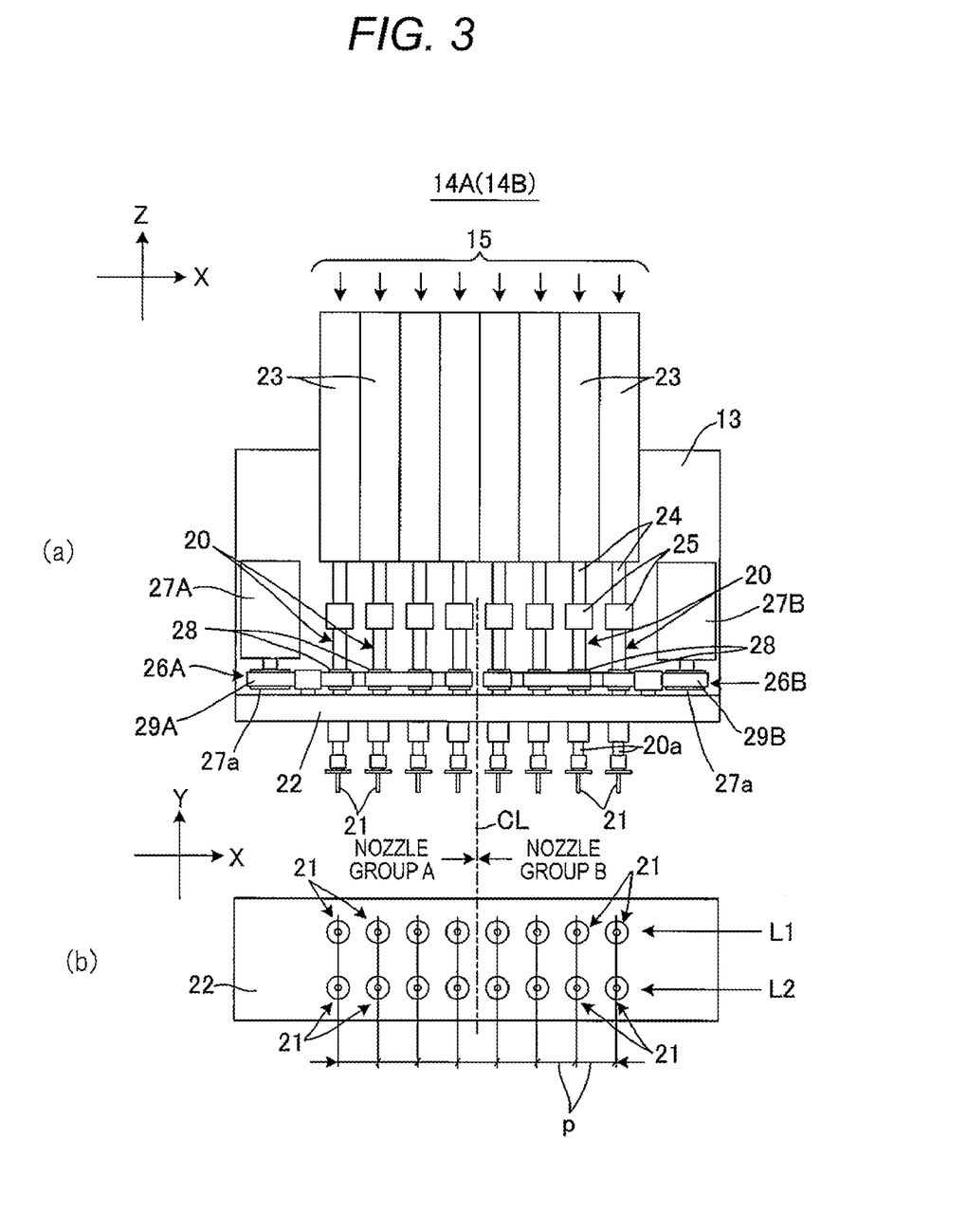
Figure 4:
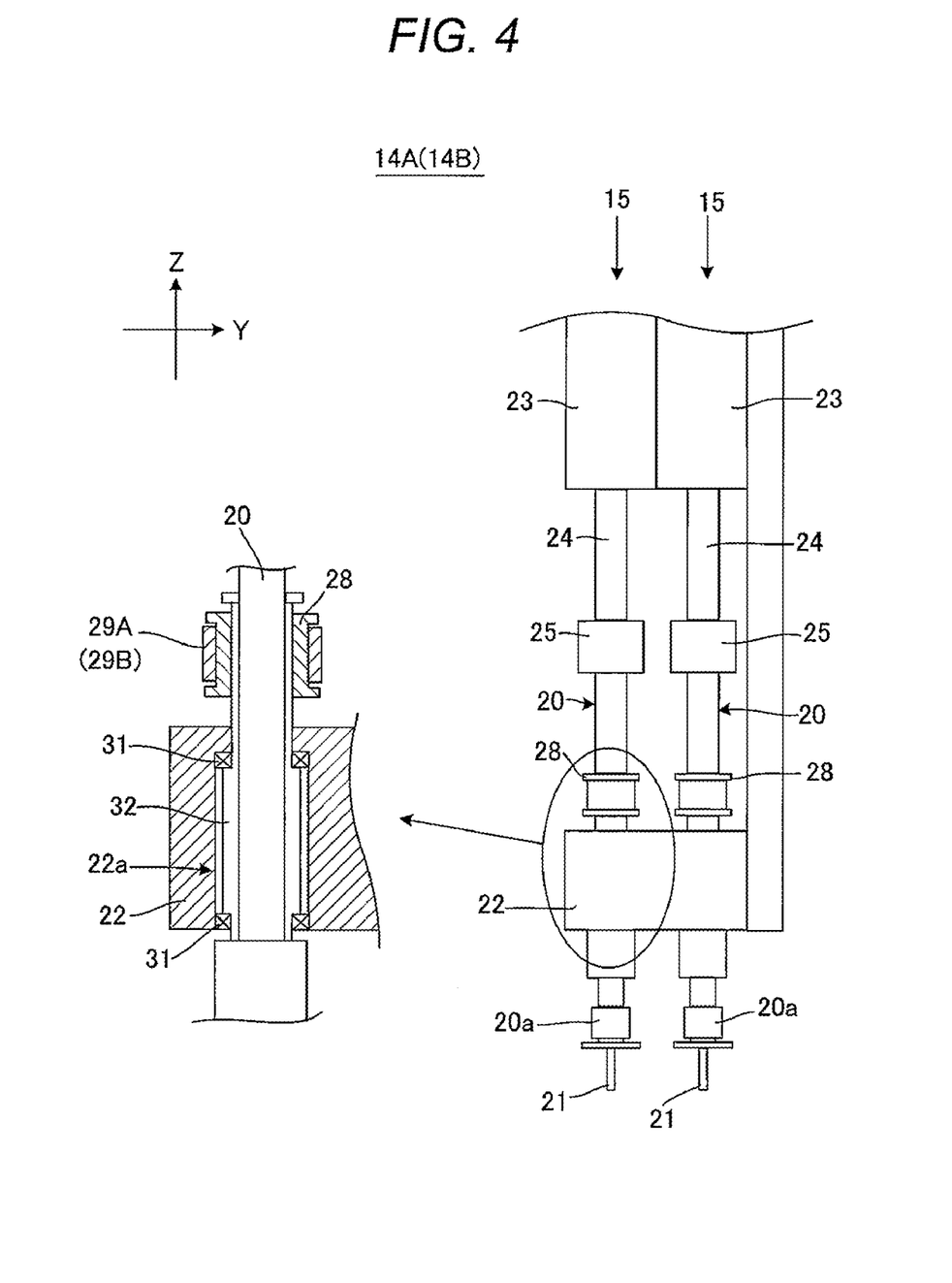
FIG. 4 is a side view of the loading head of the electronic component mounting machine of the embodiment of the present invention.
Figure 5:
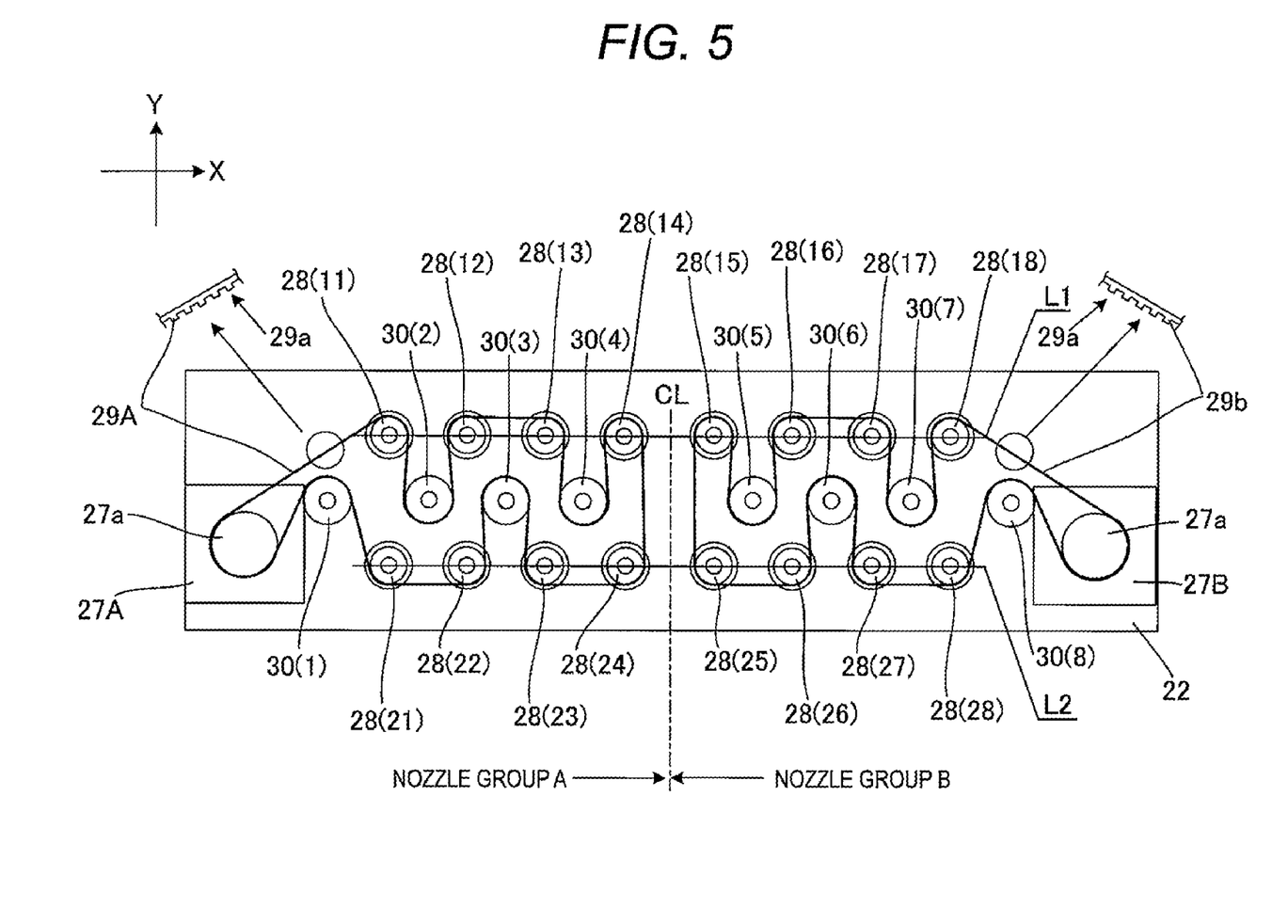
FIG. 5 is a descriptive view of a belt looped over the loading head of the electronic component mounting machine of the embodiment of the present invention.

An embodiment of the present invention is now described by reference to the drawings. FIG. 1 is an oblique perspective view of an electronic component mounting machine of an embodiment of the present invention. FIG. 2 is a plan view of the electronic component mounting machine of the embodiment of the present invention. FIGS. 3(a) and (b) are descriptive views of a structure of a loading head of the electronic component mounting machine of the embodiment of the present invention. FIG. 4 is a side view of the loading head of the electronic component mounting machine of the embodiment of the present invention. FIG. 5 is a descriptive view of a belt looped over the loading head of the electronic component mounting machine of the embodiment of the present invention.

First, a structure of an electronic component mounting machine 1 is described by reference to FIGS. 1 and 2. The electronic component mounting machine 1 has a function of: picking up an electronic component by use of suction nozzles from a plurality of part feeders arranged side by side within a component feed part; holding the picked-up electronic component by suction and mounting the electronic component on a substrate positioned at a substrate positioning part. In FIG. 1 showing the electronic component mounting machine, a substrate conveyance mechanism 2 is disposed in the center of a bench 1a along its direction X. The substrate conveyance mechanism 2 conveys in the direction X a substrate 3 on which electronic components are mounted. The substrate positioning part for positioning and holding a substrate at a mounting position is set in a conveyance path used by the substrate conveyance mechanism 2. Electronic components are mounted on the substrate 3 positioned by the substrate positioning part. A component feed part 4 is disposed on either side of the substrate conveyance mechanism 2 in such a way that the mechanism is sandwiched between the component feed parts. Each of the component feed parts 4 includes a plurality of tape feeders 5 (part feeders) arranged side by side. Each of the tape feeders 5 pitch-feeds a carrier tape storing electronic components, thereby feeding electronic components to a component loading mechanism to be described below.

A Y-axis movable table 7 having a Y-axis linear drive mechanism is horizontally disposed along its direction Y at one end of the bench 1a in its direction X. The Y-axis movable table 7 is predominantly made up of a horizontally elongated beam member 7a, and linear rails 8 are horizontally laid in the beam member 7a. Linear parts 9 joined to each of two rectangular coupling brackets 10 placed in an upright position are fitted to the linear rails 8 so as to be slidable in the direction Y. A first X-axis movable table 11A and a second X-axis movable table 11B each of which has an X-axis linear drive mechanism are joined to the two coupling brackets 10, respectively.

Each of the first X-axis movable table 11A and the second X-axis movable table 11B is predominantly made up of a beam member 11a elongated along the direction X, and linear rails 12 are horizontally laid on each of the beam members 11a. A rectangular coupling bracket 13 placed in an upright position is coupled to the corresponding linear rails 12 so as to be slidable along the direction X by way of a linear part (not shown). A first loading head 14A is coupled to the coupling bracket 13 of the first X-axis movable table 11A, and a second loading head 14B is coupled to the coupling bracket 13 of the second X-axis movable table 11B. The first loading head 14A and the second loading head 14B are moved in the direction X by the linear drive mechanisms coupled to the respective coupling brackets 13.

Each of the first loading head 14A and the second loading head 14B is a multiple head equipped with nozzle units 15 (see FIG. 3) that are a plurality of unit loading heads. Suction nozzles 21 for holding electronic components by suction are coupled to respective nozzle attachments 20a provided at lower ends of the respective nozzle units 15 (see FIG. 3). The suction nozzles 21 are elevated and lowered by means of nozzle elevation mechanisms incorporated in the respective nozzle units 15. The Y-axis movable table 7, the first X-axis movable table 11A, and the second X-axis movable table 11B are actuated, whereby the first loading head 14A and the second loading head 14B are moved in the directions X and Y. The respective nozzle units 15 pick up electronic components from the respective tape feeders 5 in the component feed part, transferring and loading the thus-picked-up electronic components on the substrate 3 positioned by the substrate conveyance mechanism 2. The Y-axis movable table 7, the first X-axis movable table 11A, and the second X-axis movable table 11B act as head movement unit that moves each of the loading heads between a corresponding component feed part 4 and a corresponding substrate conveyance mechanism 2 that is a substrate positioning part.

An image reader 6 is interposed between a corresponding substrate conveyance mechanism 2 and a corresponding component feed part 4. The respective image readers 6 have functions of reading from below images of electronic components held respectively on the first loading head 14A and the second loading head 14B as a result of the loading heads 14A and 14B picked up the electronic components from the respective component storage parts 4 performing scan action for image reading purpose. The thus-read images are subjected to recognition processing, thereby detecting positional displacements of the electronic components held on the respective loading heads.

As shown in FIG. 2, each of the first loading head 14A and the second loading head 14B has a substrate recognition camera unit 16 that moves integrally along with a corresponding loading head. The substrate recognition camera unit 16 is coupled to a lower position of the first X-axis movable table 11A and a lower position of the second X-axis movable table 11B. The substrate recognition camera unit 16 is coupled to a corresponding coupling bracket 13 with an imaging optical axis oriented downwardly; moves to an elevated position above the substrate 3 in conjunction with a corresponding loading head 14; and captures an image of the substrate 3. An imaging result is subjected to recognition processing, whereby a positional displacement of a mount position on the substrate 3 is detected. On the occasion of an electronic component being mounted on the substrate 3, a positional correction is made during loading of a component in accordance with a result of detection of the positional displacement of the electronic component and a result of detection of a positional displacement of the mount point.

The configuration of the first loading head 14A and the configuration of the second loading head 14B are now described by reference to FIGS. 3 and 4. The first loading head 14A and the second loading head 14B have the same structure and each have the plurality of nozzle units 15 (16 nozzle units in the embodiment). The nozzle units 15 are configured in such a way that the suction nozzles 21 which hold electronic components by suction are coupled to respective lower ends of a plurality of nozzle shafts 20 which can freely rotate around their axes and vertical movements and that the plurality of nozzle shafts 20 are axially held in a vertical position by a shaft bearing part 22 coupled to the lower end of each of the coupling brackets 13. The suction nozzles 21 are removably coupled to corresponding nozzle attachment parts 20a provided at the respective lower ends of the nozzle shafts 20.

FIG. 3(b) shows a lower surface of the shaft bearing part 22 in a state of the suction nozzles 21 being coupled to the respective nozzle attachment parts 20a of the respective nozzle shafts 20. The suction nozzles 21 are arranged, along the direction X, in rows and at a predetermined nozzle arrangement pitch "p" set in correspondence with the layout of the tape feeders 5 in the corresponding component feed part 4, thereby forming rows of nozzles. There are formed two rows of nozzles (rows of nozzles L1 and L2) in each of which eight suction nozzles 21 are arranged. Specifically, the two rows of nozzles L1 and L2 are provided in each of the first loading head 14A and the second loading head 14B. In each of the nozzle rows, the plurality of nozzle shafts 20 that have at their respective lower ends the suction nozzles 21 and that are movable in the vertical direction are removably arranged at a predetermined nozzle arrangement pitch into rows. The plurality of nozzle shafts 20 are separated into two nozzle groups (i.e., a nozzle group A and a nozzle group B) along an imaginary separation line CL connecting a center point of the nozzle row L1 to a center point of the nozzle row L2.

A structure of each of the nozzle units 15 is described. An upper end of each of the nozzle shafts 20 is coupled to an elevation shaft member 24 by way of a rotary joint 25. The elevation shaft member 24 is vertically actuated by a Z-axis linear motor 23 secured to the coupling bracket 13. The nozzle shaft 20 is vertically actuated by driving the Z-axis linear motor 23, whereby the corresponding suction nozzle 21 vertically moves to pick up and load an electronic component. Specifically, the Z-axis linear motor 23 and the corresponding elevation shaft member 24 make up a nozzle elevation mechanism that individually actuates the corresponding nozzle shaft 20 in the vertical direction. The rotary joint 25 couples the corresponding nozzle shaft 20 to the corresponding elevation shaft member 24 by way of a bearing, thereby allowing axial rotation of the corresponding nozzle shaft 20. It thereby becomes possible to rotate the suction nozzle 21 holding an electronic component around its axis, so that the electronic component can be rotationally positioned around the nozzle shaft.

An axial support structure and a rotational drive mode of each of the nozzle shafts 20 are now described by reference to FIG. 4. Shaft holes 22a are vertically formed in the shaft bearing part 22 so as to penetrate through the same. The nozzle shafts 20 are held by the shaft bearing part 22 by way of sleeve members 32 penetrating through interiors of the respective shaft holes 22a. An exterior surface of each of the nozzle shafts 20 fits to an interior surface of a corresponding sleeve member 32 by unit of spline grooves. The nozzle shafts 20 are thereby allowed to take vertical sliding actions with respect to the respective sleeve members 32, and rotation can be transmitted from the respective sleeve members 32 to the corresponding nozzle shafts 20 in this state. A bearing 31 is fitted to an upper end and a lower end of each of the shaft holes 22a. The bearings 31 support the corresponding sleeve member 32 along its axis while vertical positions of the bearings are held by the sleeve member 32. Specifically, each of the nozzle shafts 20 is rotatably supported along its axis by the two vertically-positioned bearings 31 by way of the corresponding sleeve member 32.

A driven pulley 28 is fitted around a portion of the sleeve member 32 that upwardly projects out of the part 22 so as to be situated above the shaft bearing part 22. The driven pulley 28 transmits rotation of a first θ-axis motor 27A to be described later to the corresponding sleeve member 32 by way of a first driving belt 29A, whereby the nozzle shaft 20 rotates along with the corresponding sleeve member 32. The driven pulley 28 also transmits rotation of a second θ-axis motor 27B to be described later to the corresponding sleeve member 32 by way of a second driving belt 29B, whereby the nozzle shaft 20 rotates along with the corresponding sleeve member 32. Rotation can be transmitted at this time while vertical movements of each of the nozzle shafts 20 are allowed.

In FIG. 3, the first θ-axis motor 27A is placed at one end (see FIG. 5) of a continuation of the nozzle rows L1 and L2 on the upper surface of the bearing part 22 and in an upright position with an output shaft of the motor 27A oriented downwardly. The first θ-axis motor 27B is placed at the other end (see FIG. 5) of the continuation of the nozzle rows L1 and L2 on the upper surface of the bearing part 22 and in an upright position with an output shaft of the motor 27B oriented downwardly. A first driving belt 29A that is an endless toothed belt is looped over a drive pulley 27a fitted to an output shaft of the first θ-axis motor 27A. A second driving belt 29B is looped over a drive pulley 27a fitted to an output shaft of the second drive motor 27B. The first driving belt 29A is assigned to the nozzle group A, and the second driving belt 29B is assigned to the nozzle group B. The first driving belt 29A is looped over the driven pulleys 28 fitted to the respective nozzle shafts 20 belonging to the nozzle group A, thereby transmitting the rotation of the first θ-axis motor 27A. The second driving belt 29B is looped over the driven pulleys 28 fitted to the respective nozzle shafts 20 belonging to the nozzle group B, thereby transmitting the rotation of the second θ-axis motor 27B.

By reference to FIG. 5, a form of the belt looped over the first loading head 14A and a form of the belt looped over the second loading head 14B are now described. FIG. 5 shows a layout of the driven pulleys 28 coupled to the respective nozzle shafts 20 and idlers 30 on the upper surface of the shaft bearing part 22 and in alignment with the nozzle rows L1 and L2 shown in FIG. 3. The idlers 30 are used as belt wheels for looping the first driving belt 29A and the second driving belt 29B in a desired form. The plurality of idlers 39 are arranged between the two rows of nozzles L1 and L2.

In FIG. 5, the plurality of driven pulleys 28 and the plurality of idlers 30 are distinguished from each other by means of adding suffixes to the numerals. First, the driven pulleys 28 are distinguished from each other in association with a nozzle group and a layout position. Specifically, the driven pulleys 28 assigned to the nozzle row L1 are denoted in sequence from the left (i.e., from a part of the nozzle group A) as driven pulleys 28(11) to 28(18). The driven pulleys 28 assigned to the nozzle row L2 are denoted in sequence from the left (a part of the nozzle group A) as driven pulleys 28(21) to 28(28).

The idlers 30 are also distinguished from each other in association with a layout position. Specifically, the idlers are denoted in sequence from the left 30(1) to 30(8). The idlers 30(1) to 30(8) are situated at substantially center positions between the two rows of nozzles L1 and L2 along the direction Y. Along the direction X, the idler 30(1) is situated between the drive pulley 27a of the first θ-axis motor 27A and the driven pulley 28(11). Three idlers 30(2), 30(3), and 30(4) assigned to the nozzle group A are situated between adjacent two driven pulleys 28 in such a way that the idler 30(2) is interposed between the driven pulleys 28(11) and 28(12); that the idler 30(3) is interposed between the driven pulleys 28(12) and 28(13); that the idler 30(4) is interposed between the driven pulleys 28(13) and 28(14).

The three idlers 30(5), 30(6), and 30(7) assigned to the nozzle group B are situated between adjacent two driven pulleys 28 in such a way that the idler 30(5) is interposed between the driven pulleys 28(15) and 28(16); that the idler 30(6) is interposed between the driven pulleys 28(16) and 28(17); and that the idler 30(7) is interposed between the driven pulleys 28(17) and 27(18). Further, an idler 30(8) is interposed between a driven pulley 28(18) and the drive pulley 27a of the second θ-axis motor 27B. A degree of freedom is provided for the positions of the idlers 30. The positions of the idlers 30 can be changed in any of the direction X and the direction Y, so long as no inconvenience occurs in looping a belt, which will be described later.

A detailed looping form of a belt is now described. The looped form of the first driving belt 29A for rotationally driving the respective nozzle shafts 20 of the nozzle group A by means of the first θ-axis motor 27A and the looped form of the second driving belt 29B for rotationally driving the respective nozzle shafts 20 of the nozzle group B by means of the first θ-axis motor 27B are symmetrical about the center line CL. Descriptions are provided solely to the nozzle group A, and descriptions about the nozzle group B are omitted.

First, a drive surface 29a of the first driving belt 29A has drive teeth and is meshed with the drive pulley 27a of the first θ-axis motor 27A. The first driving belt 29A is looped over and meshed with the driven pulley 28(11) situated at the leftmost end of the nozzle row L1. Next, the first driving belt 29A is led to the idler 30(2) situated inside, the other side of the drive surface 29a is looped, while remaining in contact with, over the idler 30(2). Subsequently, the drive surface 29a is sequentially meshed with and looped over the driven pulley 28(12) and the driven pulley 28(13). The first driving belt is led to the idler 30(4) situated inside, and the other side of the drive surface 29a is looped, while remaining in contact with, over the idler 30(4). Subsequently, the drive surface 29a is meshed with and looped over the driven pulley 28(14).

Moreover, the first driving belt 29A is sequentially looped over the driven pulley 28(24) and the driven pulley 28(23) with the drive surface 28a meshed with the pulleys. Next, after the other side of the drive surface 29a is looped over, while remaining in contact with, the idler 30(3) situated inside. The drive surface 29a is sequentially meshed with and pulled over the driven pulley 28(22) and the driven pulley 28(21). Subsequently, the first driving belt 29A is led to the idler 30(1), and the other side of the drive surface 29a is looped over the idler 30(1). The drive surface 29a is meshed with and looped over the drive pulley 27a of the first θ-axis motor 27A. All of the driven pulleys 28 are thereby meshed with the drive surface 29a of first driving belt 29A and rotationally driven by the first θ-axis motor 27A.

In the above configuration, the first θ-axis motor 27A whose output shaft is coupled to the drive pulley 27a, the driven pulleys 28 coupled to the respective nozzle shafts 20 belonging to the nozzle group A, the plurality of idlers 30 interposed between the two rows of nozzles L1 and L2, and the first driving belt 29A make up a first θ rotary drive mechanism 26A that rotates the plurality of nozzle shafts 20 belonging to the nozzle group A around their axes. Likewise, the second θ-axis motor 27B whose output shaft is coupled to the drive pulley 27a, the driven pulleys 28 coupled to the respective nozzle shafts 29 belonging to the nozzle group B, the plurality of idlers 30 interposed between the two rows of nozzles L1 and L2, and the second driving belt 29B make up a second θ rotary drive mechanism 26B that rotates the plurality of nozzle shafts 20 belonging to the nozzle group B around their axes. In the present embodiment, the θ rotary drive mechanism is individually provided for each of the nozzle groups. The driving belts 29A and 29B are looped in such a way that the drive surface 29A having drive teeth is looped around the drive pulley 27a and the driven pulleys 29 and that the other side of the drive surface 29a is guided by the plurality of idlers 30 interposed between the two rows of nozzles L1 and L2.

As mentioned above, the electronic component loading head of the present invention has the two rows of nozzles L1 and L2 including the plurality of nozzle shafts 20 arranged at a predetermined nozzle arrangement pitch and in rows. The electronic component loading head also has the θ rotary drive mechanism that rotates the nozzle shafts 20 around their axes. Each of the θ-axis rotary drive mechanisms is configured so as to include the θ-axis motor whose output shaft is coupled to the corresponding drive pulley, the driven pulleys 28 coupled to the respective nozzle shafts 20, the plurality of idlers 30 interposed between the two rows of nozzles L1 and L2; and an endless driving belt that transmits rotation of the θ-axis motor to the driven pulleys 28. The driving belt can thereby be looped over the loading head having two rows of nozzles within a minimum required occupancy area. The loading head is efficiently minimized, so that miniaturization of the electronic component mounting machine can be promoted.

Although the present invention has been described in detail and by reference to the specific embodiment, it is manifest to those skilled in the art without departing the spirit and scope of the present invention.

The present invention is based on Japanese Patent Application (JP-A-2008-263774) filed on Oct. 10, 2008, the entire subject matter of which is incorporated herein by reference.

INDUSTRIAL APPLICABILITY

An electronic component mounting machine and an electronic component loading head of the present invention are useful in a component mounting field in which an electronic component is held by suction and transferred and loaded onto a substrate because the loading head having two rows of nozzle shafts yields an advantage of the ability to promote miniaturization of the electronic component mounting machine by minimizing the loading head.

DESCRIPTIONS OF THE REFERENCE NUMERALS AND SYMBOLS

1 ELECTRONIC COMPONENT MOUNTING MACHINE

2 SUBSTRATE CONVEYANCE MECHANISM
3 SUBSTRATE
4 COMPONENT FEED PART
5 TAPE FEEDER
11A FIRST X-AXIS MOVABLE TABLE
11B SECOND X-AXIS MOVABLE TABLE
14A FIRST LOADING HEAD
14B SECOND LOADING HEAD
15 NOZZLE UNIT
20 NOZZLE SHAFT
21 SUCTION NOZZLE
23 Z-AXIS LINEAR MOTOR
26A FIRST θ ROTARY DRIVE MECHANISM
26B SECOND θ ROTARY DRIVE MECHANISM
27A FIRST θ-AXIS MOTOR
27B SECOND θ-AXIS MOTOR
28 DRIVEN PULLEY
29A FIRST DRIVING BELT
29B SECOND DRIVING BELT
29a DRIVE SURFACE
30 IDLER

The invention claimed is:

1. An electronic component mounting machine that picks up an electronic component by suction and by suction nozzles from a plurality of part feeders placed side by side within a component feed part and that mounts the electronic component on a substrate positioned by a substrate positioning part, the machine comprising:

a loading head on which the suction nozzles are provided in numbers and a head movement unit that moves the loading head between the component feed part and the substrate positioning part; and two rows of nozzles that are provided on the loading head and that includes at a predetermined nozzle arrangement pitch a plurality of nozzle shafts which have at their respective lower ends the suction nozzles and which are vertically movable, a nozzle elevation mechanism for individually actuating the nozzle shafts in a vertical direction, and a θ rotary drive mechanism that rotates the plurality of nozzle shafts around their axes, wherein the θ axis rotary drive mechanism has a θ-axis motor whose output shaft is coupled to a drive pulley, driven pulleys coupled to the respective nozzle shafts, a plurality of idlers interposed between the two rows of nozzles, and an endless driving belt that transmits rotation of the θ-axis motor to the driven pulleys; and wherein the driving belt is looped such that a drive surface having drive teeth is looped around the drive pulley and the driven pulleys and that the other side of the drive surface is guided by the idlers.

2. An electronic component head for use in an electronic component mounting machine that picks up an electronic component by suction and by suction nozzles from a plurality of part feeders placed side by side within a component feed part and that mounts the electronic component on a substrate positioned by a substrate positioning part, in which the suction nozzles are provided in numbers, the head comprising:

two rows of nozzles that are provided on the loading head and that includes at a predetermined nozzle arrangement pitch a plurality of nozzle shafts which have at their respective lower ends the suction nozzles and which are vertically movable;

a nozzle elevation mechanism for individually actuating the nozzle shafts in a vertical direction; and a θ rotary drive mechanisms that rotate the plurality of nozzle shafts around their axes, wherein the θ axis rotary drive mechanism has a θ-axis motor whose output shaft is coupled to a drive pulley, driven pulleys coupled to the respective nozzle shafts, a plurality of idlers interposed between the two rows of nozzles, and an endless driving belt that transmits rotation of the θ-axis motor to the driven pulleys; and wherein the driving belt is looped in such a way that a drive surface having drive teeth is looped around the drive pulley and the driven pulleys and that the other side of the drive surface is guided by the idlers.

3. The electronic component loading head according to claim 2, wherein the plurality of nozzle shafts are divided into two nozzle groups by a separation line that connects respective center points of the two rows of nozzles, and the θ rotary drive mechanism is individually provided for each of the nozzle groups.

* * * * *